(12) United States Patent
Ai et al.

(10) Patent No.: US 9,226,404 B2
(45) Date of Patent: Dec. 29, 2015

(54) PCB BOARD, CORE FOR MANUFACTURING THE PCB BOARD AND METHOD FOR MANUFACTURING THE PCB BOARD

(71) Applicant: NVIDIA CORPORATION, Santa Clara, CA (US)

(72) Inventors: Bing Ai, Shenzhen (CN); Biao Hu, Chengdu (CN)

(73) Assignee: NVIDIA Corporation, Santa Clara, CA (US)

(*) Notice: Subject to any disclaimer, the term of this patent is extended or adjusted under 35 U.S.C. 154(b) by 70 days.

(21) Appl. No.: 13/790,724

(22) Filed: Mar. 8, 2013

(65) Prior Publication Data

US 2014/0124249 A1 May 8, 2014

(30) Foreign Application Priority Data

Nov. 7, 2012 (CN) .......................... 2012 1 0440188

(51) Int. Cl.
| | |
|---|---|
| H05K 1/03 | (2006.01) |
| H05K 1/09 | (2006.01) |
| H05K 1/00 | (2006.01) |
| H05K 3/06 | (2006.01) |
| H05K 1/02 | (2006.01) |
| H05K 3/00 | (2006.01) |

(52) U.S. Cl.
CPC ............... *H05K 3/06* (2013.01); *H05K 1/0248* (2013.01); *H05K 1/0366* (2013.01); *H05K 1/024* (2013.01); *H05K 1/0245* (2013.01); *H05K 3/0052* (2013.01); *H05K 2201/029* (2013.01); *Y10T 442/3415* (2015.04)

(58) Field of Classification Search
CPC .......................... H05K 1/0306; H05K 1/0366
USPC .................................................. 174/255–258
See application file for complete search history.

(56) References Cited

U.S. PATENT DOCUMENTS

| | | | | |
|---|---|---|---|---|
| 5,997,983 A | * | 12/1999 | Caron et al. ................... | 428/105 |
| 2005/0034893 A1 | * | 2/2005 | McCall et al. ................. | 174/255 |
| 2006/0076683 A1 | * | 4/2006 | Nishida .......................... | 257/758 |
| 2006/0120059 A1 | * | 6/2006 | Farkas et al. ................... | 361/777 |
| 2007/0110388 A1 | * | 5/2007 | Alger et al. .................... | 385/147 |
| 2009/0294152 A1 | * | 12/2009 | Lin ................................ | 174/250 |
| 2012/0097442 A1 | * | 4/2012 | Yoshimura et al. ........... | 174/262 |

* cited by examiner

*Primary Examiner* — Timothy Thompson
*Assistant Examiner* — Sherman Ng
(74) *Attorney, Agent, or Firm* — Artegis Law Group, LLP

(57) ABSTRACT

The present invention provides a printed circuit board (PCB) board, a core for manufacturing the PCB board and a method for manufacturing the PCB board. The PCB board is in a shape of a rectangle and comprises a fiber layer formed of interlacedly weaved fiberglasses, a metal layer affixed onto a surface of the fiber layer, and a pair of differential signal traces formed on the metal layer, wherein extending directions of the fiberglasses lie at acute angles with respect to a length direction of the rectangle, and the pair of differential signal traces extends along a width direction or the length direction of the rectangle. The PCB board can effectively reduce the possibility of the skew distortion during the transmitting process of the differential signal through adjusting the angle between the fiberglasses and the edge of the core without adjusting or redesigning the original circuit layout.

13 Claims, 5 Drawing Sheets

PCB BOARD, CORE FOR MANUFACTURING THE PCB BOARD AND METHOD FOR MANUFACTURING THE PCB BOARD

CROSS-REFERENCE TO RELATED APPLICATIONS

This application claims priority to Chinese Patent Application No. 201210440188.2, filed on Nov. 7, 2012, which is hereby incorporated herein by reference.

BACKGROUND OF THE INVENTION

1. Field of the Invention

The present invention relates generally to the communication technology, in particular, to a PCB board (Printed Circuit Board), a core for manufacturing the PCB board and a method for manufacturing the PCB board.

2. Description of the Related Art

Differential signal usually uses two output drivers to drive a pair of independent and parallel differential signal traces to transmit the digital data. The phase of the signals transmitted in the pair of differential signal traces is opposite, and the information is carried by the difference between the signals in the pair of differential signal traces. Differential signal is widely used in a GPU (Graphics Processing Unit) board. The high-speed interfaces on the GPU board, such as PEX, TMDS and FBIO_CLK/DQS, usually use the differential signal to transmit and receive data. The quality of these signals is particularly important to the performance of the GPU board.

In a digital system chip, with the increase of the transmitting speed and frequency as well as the miniaturization of VLSI (Very Large Scale Integrated Circuits), the relationship between SI (Signal Integrity) and the microstructure of the circuit board has been one of the prime problems considered by the layout engineers. The microstructure of the circuit board has begun to influence the quality of differential signal. For example, the different propagation delays appear on the pair of the differential signal traces. As for the circuit board with a lower transmitting speed, the difference between the propagation delays is negligible. However, as for the GPU board, the transmitting speed of differential signal thereon is usually greater than 2.5 GT/s, even up to 10 GT/s (for example, a GF10xGPU board having a GDDR5 memory). Therefore, the difference of the propagation delays may lead to the greater skew distortion between the pair of differential signal traces. The skew distortion may exceed the mismatch margin of the pair of differential signal traces, and then seriously influence the performance of the GPU board.

Therefore, there is a need of providing a PCB board, a core for manufacturing the PCB board and a method for manufacturing the PCB board to solve the above problem in the prior art.

SUMMARY OF THE INVENTION

In order to solve the above problem, a PCB board is provided according to one aspect of the invention. The PCB board is in a shape of a rectangle and comprises a fiber layer and a metal layer affixed onto a surface of the fiber layer, wherein the fiber layer is formed of interlacedly weaved fiberglasses, extending directions of the fiberglasses make acute angles with a length direction of the rectangle, a pair of differential signal traces is formed on the metal layer, and the pair of differential signal traces extends along a width direction or the length direction of the rectangle.

Preferably, the acute angles are 10°-80°.
Preferably, the acute angles are 40°-50°.
Preferably, the metal layer is affixed to the fiber layer through epoxy resin.
Preferably, the fiber layer is made of a fiberglass sheet and epoxy resin.
Preferably, the metal layer is a copper foil.

A core for manufacturing the PCB board is provided according to another aspect of the invention. The core is in a shape of a rectangle and comprises a fiber layer and a metal layer affixed onto a surface of the fiber layer, wherein the fiber layer is formed of interlacedly weaved fiberglasses, and extending directions of the fiberglasses make acute angles with a length direction of the rectangle.

Preferably, the acute angles are 10°-80°.
Preferably, the acute angles are 40°-50°.
Preferably, the metal layer is affixed to the fiber layer through epoxy resin.
Preferably, the fiber layer is made of a fiberglass sheet and epoxy resin.
Preferably, the metal layer is a copper foil.

A method for manufacturing the PCB board is provided according to yet another aspect of the invention. The method comprises: providing a fiber layer which is formed of interlacedly weaved fiberglasses; affixing a metal layer onto a surface of the fiber layer to form a core blank; cutting the core blank into a rectangle and enabling a length direction of the rectangle to make acute angles with extending directions of the fiberglasses; and forming a pair of differential signal traces on the metal layer, wherein the pair of differential signal traces extends along a width direction or the length direction of the rectangle;

Preferably, the pair of differential signal traces is formed on the metal layer through etching.
Preferably, the acute angles are 10°-80°.
Preferably, the acute angles are 40°-50°.
Preferably, the metal layer is affixed to the fiber layer through epoxy resin.
Preferably, the fiber layer is made of a fiberglass sheet and epoxy resin.
Preferably, wherein the metal layer is a copper foil.

To sum up, the PCB board provided by the present invention can effectively reduce the possibility of the skew distortion during the transmitting process of the differential signal through adjusting the angle between the fiberglasses and the edge of the core, and the layout designers needn't adjust or redesign the original circuit layout. Consequently, the original manufacturing cycle and manufacturing cost can be maintained on the case that the problems existed in the prior art can be solved.

A serial of simplified conceptions are incorporated into the summary of the invention, which will be further described in more detail in the detailed description. The summary of the invention neither implies that it is intended to limit the essential features and necessary technical features of the technical solution to be protected, nor implies that it is intended to define the protection scope of the technical solution to be protected.

Advantages and features of the present invention will be described in detail below in connection with the accompanying drawings.

BRIEF DESCRIPTION OF THE DRAWINGS

The following drawings of the present invention as a part of the present invention herein are used for understanding of the present invention, the embodiments and the descriptions thereof are illustrated in the drawings for explaining the principle of the present invention. In the drawings.

DETAILED DESCRIPTION

A plenty of specific details are presented so as to provide more thoroughly understanding of the present invention in the description below. However, the present invention may be implemented without one or more of these details, as is obvious to those skilled in the art. In other examples, some of the technical features known in the art are not described so as to avoid confusions with the present invention.

It will be understood that an element or layer can be directly "on", "adjacent to", "connected to" or "coupled to" another element or layer, or a mediate element or layer is disposed therebetween, when it refers that the element or layer is "on", "adjacent to", "connected to" or "coupled to" another element or layer. On the contrary, when an element or layer is "directly on", "directly adjacent to", "directly connected to" or "directly coupled to" another element or layer, there is no mediate element or layer.

Figure 1:
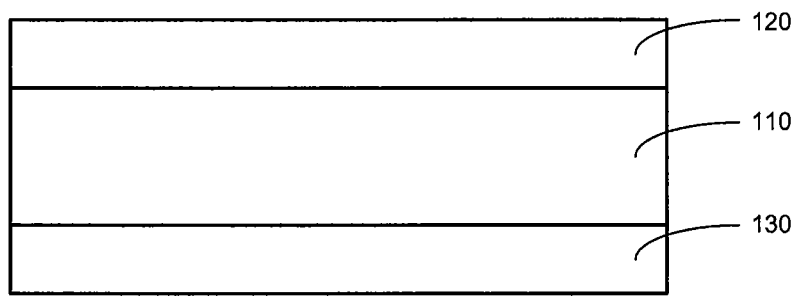
FIG. 1 is a sectional schematic view of a core according to one embodiment of the invention.

According to one aspect of the invention, a core 100 for manufacturing a PCB board is provided. The core 100 is in the shape of a rectangle. FIG. 1 is a sectional view of the core 100. The core 100 comprises a fiber layer 110 and metal layers 120 and 130, as shown in FIG. 1.

Figure 2:
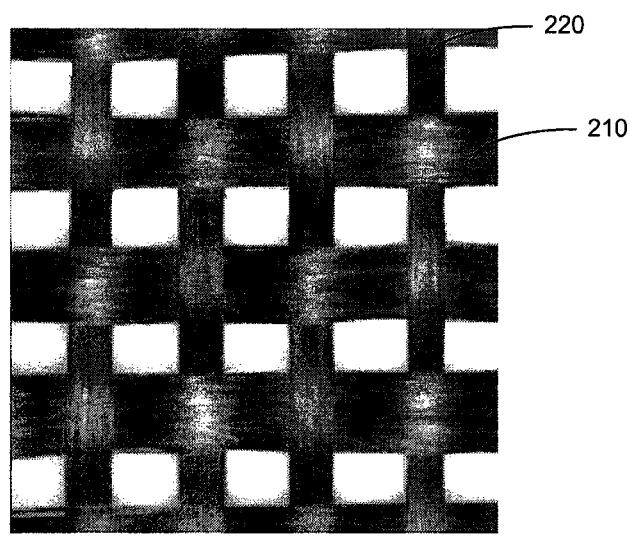
FIG. 2 is a microscopic enlarged view of a fiber layer according to one embodiment of the invention.
Figure 3:
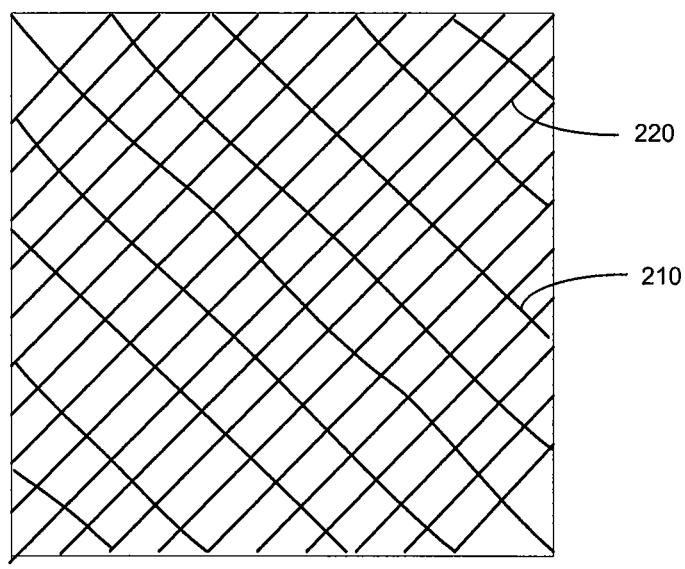
FIG. 3 is a top schematic view of the fiber layer according to one embodiment of the invention.

The fiber layer 110 may be formed of interlacedly weaved fiberglasses. FIG. 2 illustrates the structure of the interlacedly weaved fiberglasses. Warp yarns 210 and Fill yarns 220 formed of fiberglasses extend along two orthogonal directions and weave interlacedly so as to form a structure similar to the textile fabric, as shown in FIG. 2. As an example, the fiber layer 110 may be formed by processing FR4 fiberglasses, that is, the Warp yarns 210 and the Fill yarns 220 are formed of FR4 fiberglasses. FR4 signifies a grade of a flame resistant material which can extinguish by itself after the combustion. To eliminate the skew distortion of the differential signal transmitted by the pair of differential signal traces, the extending directions of the fiberglasses in the fiber layer 110 make acute angles with the length direction of the rectangle. FIG. 3 is a top view of the fiber layer 110. As shown in FIG. 3, the extending directions of the Warp yarns 210 and the Fill yarns 220 make angles with the edges of the rectangular fiber layer 110, such that each of the Warp yarns 210 and each of the Fill yarns 220 make acute angles with the length direction of the fiber layer 110. It will be understood that each of the Warp yarns 210 and each of the Fill yarns 220 also make acute angles with the width direction of the fiber layer 110. The effect brought by the structure will be described in detail below.

Return to FIG. 1, the metal layers 120 and 130 are affixed onto a surface of the fiber layer 110. Although FIG. 1 illustrates that the metal layers 120 and 130 are affixed onto an upper surface and a lower surface of the fiber layer 110, respectively, the metal layer 120 or 130 may be affixed onto only one surface of the fiber layer 110 as needed. The circuit pattern is formed by etching the metal layers 120 and 130 when the core is used to manufacture the PCB board, and thus, the metal layers 120 and 130 are preferably made of the metal material with a great conductive performance, such as silver, aluminum, tungsten, copper or the alloy of them. In view of the stability and etching process, etc., preferably, the metal layers 120 and 130 may be copper foils.

As an example, the metal layers 120 and 130 are affixed to the fiber layer 110 through the epoxy resin. The epoxy resin can melt to flow under a high temperature, and therefore, the metal layers 120 and 130 can be affixed to the fiber layer 110. In addition, the epoxy resin also has great performances of heat resistance, stability and insulation under a low-temperature environment (in the temperature range of the PCB board normally used).

Preferably, the fiber layer 110 may be made of a fiberglass sheet and epoxy resin. The epoxy resin may cover the surface of the fiberglass sheet. When the metal layers 120 and 130 are affixed to the fiber layer 110 through a hot-press approach, the epoxy resin may not only act as an adhesive between the fiber layer 110 and the metal layers 120 and 130, but also fill the space in the fiberglass sheet. The fiberglass sheet may include one or more of the fiberglass cloth, the fiberglass prepreg and the fiberglass non-woven prepreg, etc.

Figure 4:
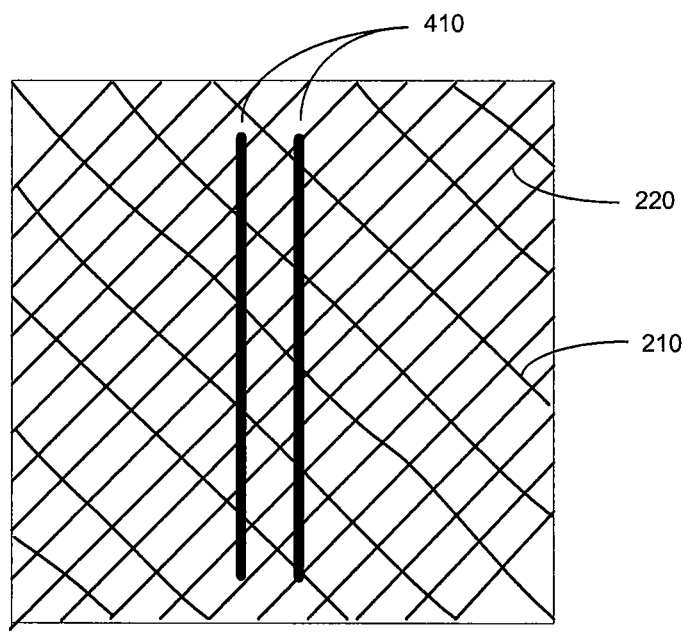
FIG. 4 is a top schematic view of a PCB board according to one embodiment of the invention.
Figure 5:
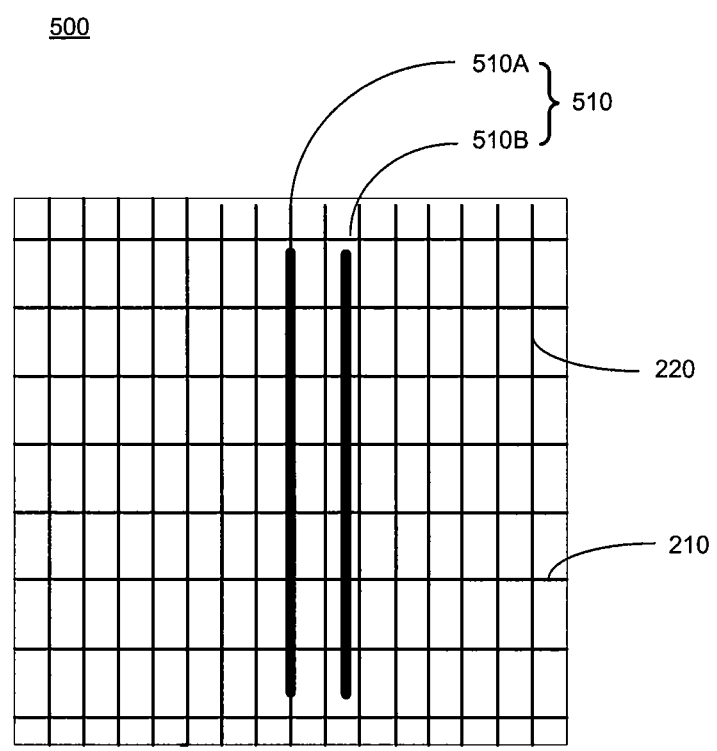
FIG. 5 is a top schematic view of the PCB board, wherein a pair of differential signal traces is formed parallel or perpendicular to the fiberglasses.
Figure 6:
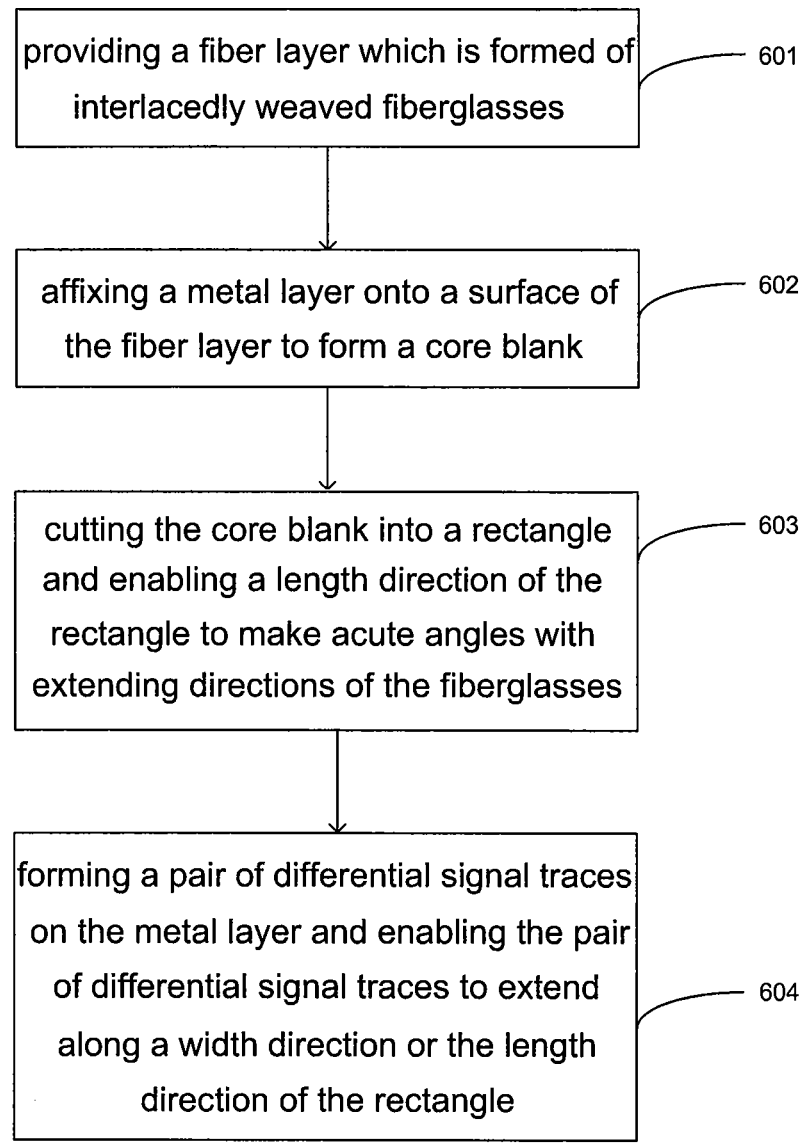
FIG. 6 is a flow chart for manufacturing the PCB board according to one embodiment of the invention.

According to another aspect of the invention, a PCB board 400 is also provided. A pair of differential signal traces 410 is formed on the PCB board 400, as shown in FIG. 4. Specifically, the pair of differential signal traces 410 may be formed by etching the metal layers 120 and/or 130 of any core 110 aforementioned. To eliminate the skew distortion of the differential signal transmitted by the pair of differential signal traces 410, the pair of differential signal traces 410 extends along a width direction or a length direction of the rectangle, such that the pair of differential signal traces 410 as well as the Warp yarns 210 and the Fill yarns 220 are angled relative to the width direction or the length direction. Concerning the unexpected technical effect, the possible reason analyzed by the applicant is as follows:

If the pair of differential signal traces 510 is formed along the Fill yarns 220, it may appear that the first differential signal trace 510A of the pair of differential signal traces 510 just lands on the Fill yarn 220, while the second differential signal trace 510B of the pair of differential signal traces 510 is located between two Fill yarns 220. The adhesive (such as the epoxy resin, etc.) may be filled between the Warp yarns 210 and the Fill yarns 220. It causes that the ambient substance around the first differential signal trace 510A is different from that around the second differential signal trace 510B. That is, the dielectric constant of the dielectric layer around the first differential signal trace 510A is different from that of the dielectric layer around the second differential signal trace 510B. The dielectric constant of the dielectric layer formed of a plurality of materials may be calculated by the following formula:

$$D_k = D_k(a) \times M(a)\% + D_k(b) \times M(b)\%$$

wherein $D_k$ is the total dielectric constant of a dielectric layer, $D_k(a)$ is the dielectric constant of the first material included in the dielectric layer, $M(a)\%$ is the mass fraction of the first material in dielectric layer, $D_k(b)$ is the dielectric constant of the second material included in dielectric layer, and $M(b)\%$ is the mass fraction of the second material in dielectric layer.

The Warp yarns 210 and the Fill yarns 220 are made of fiberglasses, and the dielectric constant of the fiberglasses is about 5.6. However, the dielectric constant of the epoxy resin correspondingly used in F4 fiberglasses is about 3.2. Thus it can be seen that the dielectric constants of the dielectric layers around the first differential signal trace 510A and the second differential signal trace 510B are different, wherein the dielectric constant of the dielectric layer around the second differential signal trace 510B is also relevant to the dimension of the fiberglasses and the space between the fiberglasses. The difference between the dielectric constants of dielectric layers around the first differential signal trace 510A and the second differential signal trace 510B may lead to the impedance mismatch, and further lead to the transmission delay. To a PCB board with a lower transmitting speed, the skew distortion is negligible. However, to a PCB board with a higher transmitting speed, the skew distortion may exceed the mismatch margin of the pair of differential signal traces.

When the pair of differential signal traces 510 is formed along the Warp yarns 210, the phenomenon similar to that aforementioned may be appeared. That is, one of the pair of differential signal traces just lands on a Warp yarn 210, while the other is located between two Warp yarns 210. The ambient substances around the pair of differential signal traces are similar to those described above, and thus it is no longer described in detail.

The PCB board 400 provided by the invention enables the pair of differential signal traces 410 to make angles with the Warp yarns 210 and the Fill yarns 220, therefore, it can eliminate the said effect to some extent. The balance is formed between the pair of differential signal traces 410 to reduce the impedance mismatch.

There is a possibility that the angle between the fiberglasses and the edge of the rectangular core deviates from a predetermined value during the manufacture of the core, and the deviation is usually less than 5°. Consequently, the acute angle between the fiberglasses and the edge of the rectangular core (i.e., the length direction) may preferably be 10°-80°, so as to eliminate the deviation caused by the manufacture of the core. Further, in order to match the impedance of the first differential signal trace 510A with the impedance of the second differential signal trace 510B as much as possible, preferably, the acute angles between the fiberglasses and the edge of the rectangular core (the length direction) may be 40°-50°.

It will be understood that the PCB board can include one or more cores according to the structure and function of the PCB board to be manufactured. When the PCB board includes a plurality of cores, the pair of differential signal traces 410 can be formed on one or more of the plurality of cores.

To sum up, the PCB board provided by the present invention can effectively reduce the possibility of the skew distortion during the transmitting process of the differential signal through adjusting the angle between the fiberglasses and the edge of the core, and the layout designers needn't adjust or redesign the original circuit layout. Consequently, the original manufacturing cycle and manufacturing cost can be maintained on the case that the problems existed in the prior art can be solved.

According to yet another aspect of the invention, a method for manufacturing the PCB board is provided. The method comprises the following steps:

First, in step 601, a fiber layer which is formed by interlacedly weaved fiberglasses is provided. The Warp yarns 210 and the Fill yarns 220 formed of fiberglasses extend along two orthogonal directions and weave interlacedly so as to form a structure similar to the textile fabric, as shown in FIG. 2.

Then, in step 602, a metal layer is affixed onto a surface of the fiber layer to form a core blank. The metal layers may be affixed onto an upper surface and a lower surface of the fiber layer respectively, or be affixed onto only one of the upper surface and the lower surface. Preferably, the metal layer is affixed to the fiber layer through the epoxy resin. Preferably, the fiber layer is made of the fiberglass sheet and the epoxy resin. The epoxy resin may cover the surface of the fiberglass sheet. When the metal layer is affixed to the fiber layer by the hot-press approach, the epoxy resin may not only act as an adhesive between the fiber layer and the metal layer, but also fill the space in the fiberglass sheet. As an example, the metal layer may be a copper foil.

Next, in step 603, the core blank is cut into a rectangle, and the length direction of the rectangle makes acute angles with the extending directions of the fiberglasses. In view of the deviation brought by the manufacturing process, the acute angles may preferably be 10°-80°. In order to match the impedance of the first differential signal trace 510A with the impedance of the second differential signal trace 510B as much as possible, the acute angles can further preferably be 40°-50°.

Finally, in step 604, a pair of differential signal traces is formed on the metal layer. The pair of differential signal traces extends along the width direction or the length direction of the rectangle so as to form the balance between the pair of differential signal traces. As an example, the pair of differential signal traces is formed on the metal layer by an etching process. The etching process not only has a higher accuracy, but also can form the circuit pattern with a smaller dimension (up to tens of nanometers). Therefore, the consistency of the shape and dimension of the pair of differential signal traces is improved such that the skew distortion of the signal output by the pair of differential signal traces is reduced.

The method for manufacturing the PCB board may only adjust the angles between the fiberglasses of the core and the edge of the core in the process for cutting the core. It may reduce the possibility of the skew distortion during the transmitting process of the differential signal, and avoid influencing the performance of the GPU board. In addition, the method has no influence on the work of the layout designers. Usually, adjusting or redesigning the circuit layout is a boring and time-consuming work.

The present invention has been described by the above-mentioned embodiments. However, it will be understand that the above-mentioned embodiments are for the purpose of demonstration and description and not for the purpose of limiting the present to the scope of the described embodiments. Moreover, those skilled in the art could appreciated that the present invention is not limited to the above mentioned embodiments and that various modifications and adaptations in accordance of the teaching of the present invention may be made within the scope and spirit of the present invention. The protection scope of the present invention is further defined by the following claims and equivalent scope thereof.

The invention claimed is:

1. A printed circuit board (PCB) being in a shape of a rectangle, the PCB comprising:
   a fiber layer formed of interlacedly weaved fiberglasses;
   a metal layer affixed onto a surface of the fiber layer; and
   a pair of differential signal traces formed on the metal layer,
   wherein extending directions of the fiberglasses lie at acute angles with respect to a length direction of the rectangle, and the pair of differential signal traces extends along a width direction or the length direction of the rectangle, wherein the acute angles are between 40°-44°, inclusive, or between 46°-50°, inclusive.

2. The PCB according to claim 1, wherein the metal layer is affixed to the fiber layer through epoxy resin.

3. The PCB according to claim 1, wherein the fiber layer is made of a fiberglass sheet and epoxy resin.

4. The PCB according to claim 1, wherein the metal layer is a copper foil.

5. A core for manufacturing a printed circuit board (PCB), the core being in a shape of a rectangle and comprising a fiber layer and a metal layer affixed onto a surface of the fiber layer, wherein the fiber layer is formed of interlacedly weaved fiberglasses, and extending directions of the fiberglasses lie at acute angles with respect to a length direction of the rectangle, wherein the acute angles are between 40° 44°, inclusive, or between 46°-50°, inclusive.

6. The core according to claim 5, wherein the metal layer is affixed to the fiber layer through epoxy resin.

7. The core according to claim 5, wherein the fiber layer is made of a fiberglass sheet and epoxy resin.

8. The core according to claim 5, wherein the metal layer is a copper foil.

9. A method for manufacturing a printed circuit board (PCB), comprising:

providing a fiber layer which is formed of interlacedly weaved fiberglasses;

affixing a metal layer onto a surface of the fiber layer to form a core blank;

cutting the core blank into a rectangle such that a length direction of the rectangle lies at acute angles with respect to extending directions of the fiberglasses, wherein the acute angles are between 40°-44°, inclusive, or between 46°-50°, inclusive; and forming a pair of differential signal traces on the metal layer, wherein the pair of differential signal traces extends along a width direction or the length direction of the rectangle.

10. The method according to claim 9, wherein the pair of differential signal traces is formed on the metal layer through etching.

11. The method according to claim 9, wherein the metal layer is affixed to the fiber layer through epoxy resin.

12. The method according to claim 9, wherein the fiber layer is made of a fiberglass sheet and epoxy resin.

13. The method according to claim 9, wherein the metal layer is a copper foil.

* * * * *